United States Patent [19]

Roppel et al.

[11] Patent Number: 4,691,662
[45] Date of Patent: Sep. 8, 1987

[54] DUAL PLASMA MICROWAVE APPARATUS AND METHOD FOR TREATING A SURFACE

[75] Inventors: Thaddeus A. Roppel; Jes Asmussen, both of Okemos; Donnie K. Reinhard, East Lansing, all of Mich.

[73] Assignee: Michigan State University, East Lansing, Mich.

[21] Appl. No.: 873,694

[22] Filed: Jun. 12, 1986

Related U.S. Application Data

[60] Continuation-in-part of Ser. No. 798,309, Nov. 15, 1985, Pat. No. 4,630,566, which is a division of Ser. No. 641,190, Aug. 16, 1984, Pat. No. 4,585,668, and a continuation-in-part of Ser. No. 849,052, Apr. 7, 1986, which is a continuation-in-part of Ser. No. 641,190, Aug. 16, 1984, Pat. No. 4,585,668.

[51] Int. Cl.$^4$ .......................... C23C 14/00; B05D 3/06
[52] U.S. Cl. ................... 118/50.1; 118/723; 118/730; 427/39; 427/41; 427/47
[58] Field of Search .............. 118/50.1, 723, 730; 427/45.1, 38, 39, 47, 40, 41, 34

[56] References Cited

U.S. PATENT DOCUMENTS

| | | | |
|---|---|---|---|
| 4,507,588 | 3/1985 | Asmussen et al. | 315/39 |
| 4,511,593 | 4/1985 | Brandolf | 118/50.1 X |
| 4,512,867 | 4/1985 | Andreev et al. | 118/50.1 X |
| 4,514,437 | 4/1985 | Nath | 118/50.1 X |

Primary Examiner—Thurman K. Page
Attorney, Agent, or Firm—Ian C. McLeod

[57] ABSTRACT

A plasma apparatus which generates a radio frequency (UHF or microwave) disk plasma 16 and a hybrid plasma 45 derived from the disk plasma. The microwave plasma acts as a source of excited ion and free radical species and electrons for the second plasma which is hybrid in that it contains species from both microwave and dc (or rf depending on bias) excitation. The hybrid plasma can be used to treat an article 43 with different species than are present in the disk plasma and provides more control in this regard than a single plasma.

17 Claims, 3 Drawing Figures

1

DUAL PLASMA MICROWAVE APPARATUS AND METHOD FOR TREATING A SURFACE

CROSS-REFERENCE TO RELATED APPLICATION

This application is a continuation-in-part of U.S. applicaton Ser. No. 798,309, filed Nov. 15, 1985 and now U.S. Pat. No. 4,630,566 which is a division of U.S. application Ser. No. 641,190, filed Aug. 16, 1984, now U.S. Pat. No. 4,585,668 and a continuation-in-part of application Ser. No. 849,052 filed Apr. 7, 1986 which is a continuation-in-part of Ser. No. 641,190 referred to previously.

BACKGROUND OF THE INVENTION (1) Field of the Invention

The present invention relates to a dual plasma UHF or microwave apparatus and method. In particular the present invention relates to a UHF or microwave plasma apparatus which allows the formation of a second hybrid plasma for treatment of an article separate from a first disk plasma which is the source of the hybrid plasma. The hybrid plasma is a combination of a microwave and a D.C. or R.F. plasma and is used to treat a surface of an article in a different manner than the disk plasma.

(2) Prior Art

U.S. Pat. No. 4,507,588 by some of the inventors herein describes some of the prior art. It is not believed that a dual microwave plasma apparatus has been described by the prior art.

OBJECTS

It is therefore an object of the present invention to provide a UHF or microwave, plasma apparatus which produces separate dual plasmas including a hybrid plasma having improved properties for treating an article. Further it is an object of the present invention to provide a UHF or microwave plasma apparatus for producing a hybrid plasma which is relatively simple to construct. These and other objects will become increasingly apparent by reference to the following description and the drawings.

IN THE DRAWINGS

Figure 3:
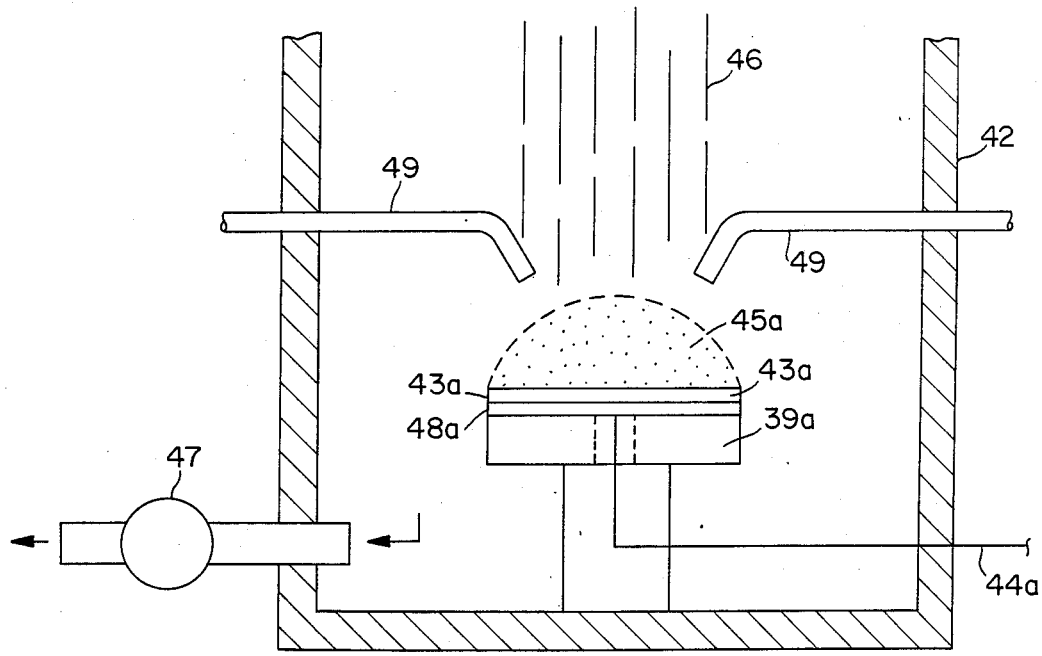

FIG. 3 is a front partial cross-sectional view of another embodiment of the UHF or microwave plasma apparatus showing a hybrid plasma 45a with gas conduits 49 provided for enhancing the properties of the hybrid plasma 45a.

GENERAL DESCRIPTION

The present invention relates to an ion generating apparatus for treating a surface which comprises: a plasma source employing a radio frequency, including UHF or microwave, wave coupler or applicator which is metallic and in the shape of a hollow cavity and which is excited in one or more of its TE or TM modes of resonance and optionally including a static magnetic field surrounding the plasma source which aids in coupling electromagnetic energy to plasma electrons at electron cyclotron resonance and aids in confining the charged species in the discharge chamber, wherein the plasma is maintained at a reduced pressure in operation and wherein the ion source apparatus includes an electrically insulated chamber having a central longitudinal axis mounted in closely spaced relationship to an area of the applicator defining an opening from the chamber; perforated means adjacent the opening which allows ions, free radicals and electrons to be removed from the plasma; gas supply means for providing a gas which is ionized to form the plasma in the insulated chamber, wherein the radio frequency wave, including UHF and microwave, applied to the applicator creates and maintains the plasma in the shape of an elongate plasma disk perpendicular to and surrounding the central longitudinal axis in the chamber; metal plate means in the cavity mounted perpendicular to the axis; a probe means (including a conventional loop) connected to and extending inside the applicator for coupling electromagnetic energy to the applicator, wherein the plate means and the probe means in the applicator achieves the selected TE or TM mode of resonance of the radio frequency wave in the applicator; ion attracting means mounted in spaced relationship to the perforated means outside of the chamber for attachment to the surface to be treated for purposes of igniting a hybrid plasma and for attracting ions from the plasma to the surface by bias means providing a suitable voltage potential; and a platform means supporting the surface to be treated and electrically insulated from the ion attracting means, wherein the ion attracting means and platform means are spaced from the plasma in the chamber such that the hybrid plasma is formed adjacent to the ion attracting means which is separate from the elongate plasma disk. The plate means and the probe means are preferably moveable to change the mode of resonance of the UHF or microwave applicator and to impedance match the applicator to the input transmission system.

Further the present invention relates to a method for treating a surface which comprises: providing an ion generating apparatus including a plasma source employing a radio frequency, including UHF or microwave, wave coupler or applicator, which is metallic and in the shape of a hollow cavity and which is excited in one or more of its TE or TM modes of resonance and optionally including a static magnetic field surrounding the plasma source which aids in coupling electromagnetic energy to the plasma electrons at electron cyclotron resonance and aids in confining the charged species in the discharge chamber, wherein the plasma is maintained at a reduced pressure in operation, wherein the ion generating apparatus further includes an electrically insulated chamber having a central longitudinal axis and mounted in closely spaced relationship to an area of the applicator defining an opening from the chamber, further includes perforated means adjacent the opening which allows the ions, free radicals and electrons to be removed from the chamber, further includes a gas supply means for providing a gas which is ionized to form the plasma in the insulated chamber, wherein the radio frequency wave (including UHF and microwave) applied to the applicator creates and then maintains the plasma in the shape of an elongate, thin plasma disk perpendicular to and surrounding the central axis in the chamber, further includes a metal plate means mounted perpendicular to the axis, further including a probe means connected to and extending inside the applicator for coupling electromagnetic energy to the applicator, wherein the plate means and the probe means in the applicator achieves a selected TE or TM mode of resonance of the radio frequency wave in the applicator and in order to match the applicator, further includes ion attracting means mounted in spaced relationship to the perforated means outside of the chamber attached to the surface to be treated for purposes of igniting the plasma and for attracting ions from the plasma by bias means providing a suitable voltage potential and further including a platform means supporting the surface to be treated and electrically insulated from the ion attracting means wherein the ion attracting means and platform means are spaced from the plasma in the chamber such that a hybrid ion and microwave plasma is formed adjacent to the ion attracting means which is separate from the elongate plasma disk; forming the plasma disk in the chamber and the separate hybrid plasma adjacent the ion attracting means; and attracting the ions from the hybrid plasma to the surface with the bias means having a suitable voltage potential attached to the surface.

As used herein the terms "coupler" and "applicator" are used interchangeably. The latter term is preferred.

The microwave or UHF plasma apparatus described herein is based upon that described in earlier U.S. Pat. No. 4,507,588. A microwave discharge is created in a disk shaped region which is separated from the applicator (cavity) aperture (or antenna probe) by a quartz confining enclosure or disk. The applicator is in the shape of a hollow, cylindrical cavity which focuses and matches the microwave energy into the plasma region utilizing single or controlled multimode electromagnetic excitation and "internal cavity" matching. The apparatus of U.S. Pat. No. 4,507,588 can be used as a broad-beam ion source or as a plasma source for materials processing. U.S. patent application Ser. No. 849,052 filed Apr. 7, 1986 describes the use of magnets for confining disk plasma. This apparatus can be used with the present invention.

SPECIFIC DESCRIPTION

Figure 1:
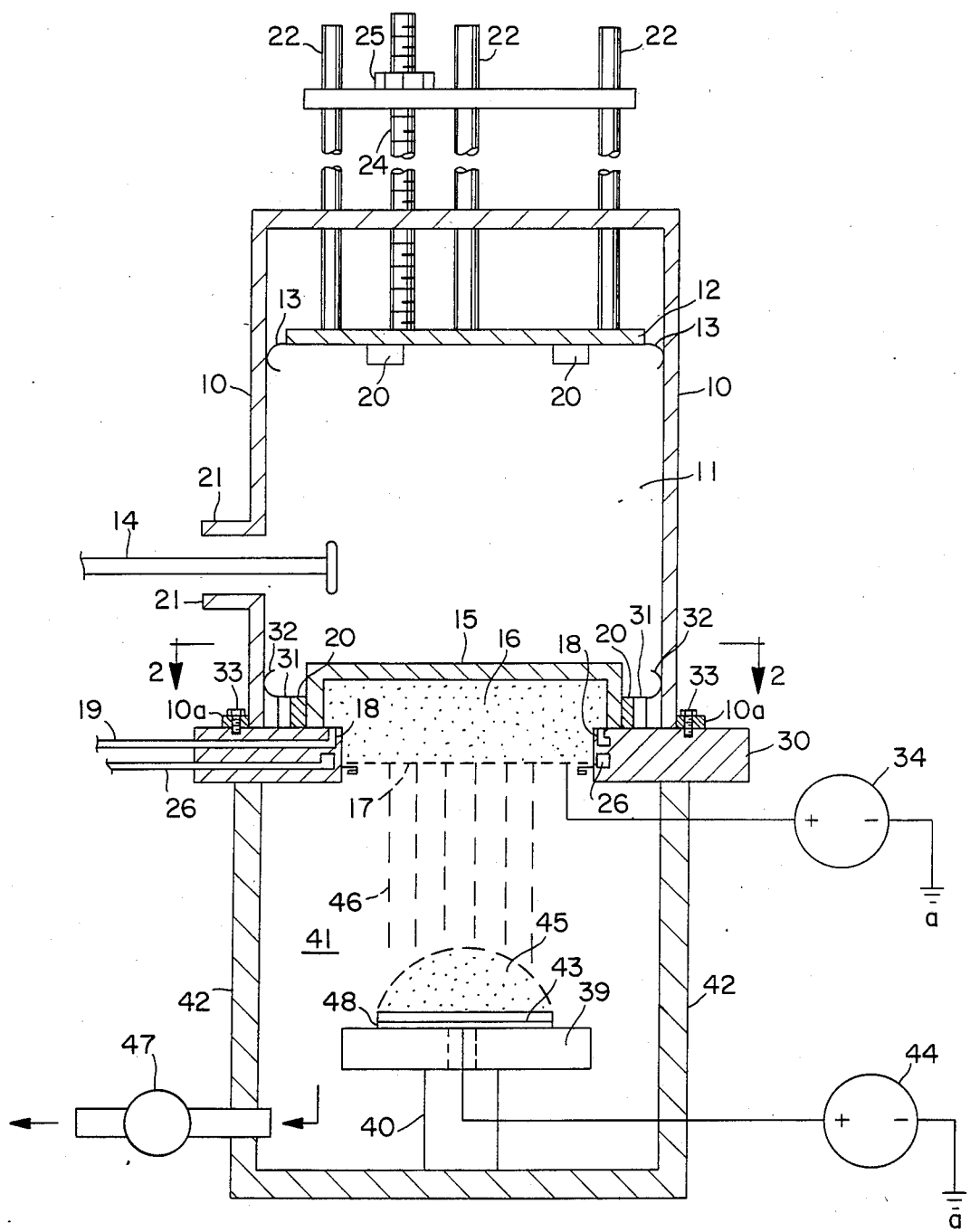
FIG. 1 is a front cross-sectional view of the UHF or microwave apparatus of the present invention particularly illustrating a disk plasma 16 and a separate derived hybrid plasma 45.
Figure 2:
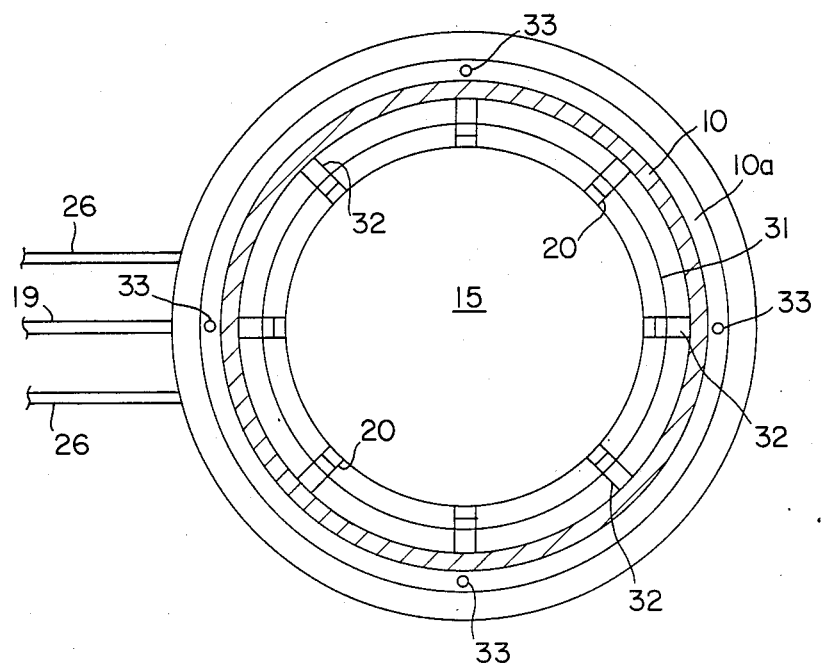
FIG. 2 is a plan cross-sectional view along line 2—2 of FIG. 1.

FIGS. 1 and 2 show the preferred improved plasma generating apparatus of the present invention. The basic construction of the apparatus is described in U.S. Pat. No. 4,507,588. The apparatus includes cylinder 10 forming the microwave cavity 11 with a sliding short 12 for adjusting the length of the cavity 11. Brushes 13 electrically contact the cylinder 10. The probe 14 is mounted in cavity 11 by conduit 21. Radial penetration of the probe 14 into the cavity 11 varies the electromagnetic mode of coupling to the plasma in the cavity 11. Sliding short or plate 12 is moved back and forth in cavity 11 on rods 22 to adjust to a specific electromagnetic mode of the microwave cavity 11 using conventional adjustment means such as threaded post 24 and nut 25 such as described in U.S. Pat. No. 4,507,588. Motors and gearing can be used for movement of the short 12 (not shown). The impedance tuning within a particular mode is accomplished by iterative movements of the probe 14 perpendicular to the longitudinal axis of the cavity 11 and movement of the plate 12 along the axis. Generally the adjustments are made by threaded members on the plate 12. The probe 14 is frictionally engaged with the cavity 11 or is moved by threaded members (not shown).

A quartz dish or chamber 15 preferably shaped like a petri dish or a circular cylinder closed on the bottom and open at the top which defines the disk shaped plasma region 16 along with base 30 and grid or screen 17 or other perforated means. A biased grid 17 must be insulated from cavity 11 when a bias is applied. The grid or screen 17 can have an electrical bias supplied by a D.C. or R.F. Voltage source 34 to attract ions from the plasma. The bias + or − removes ions or electrons from the plasma region 16. Gas is fed by tube 19 to annular ring 18 to introduce molecules of the gas which forms the plasma in region 16. Optionally a cooling line 26 is provided which cools the base 30. The cylinder 10 slides onto the base 30 and is held in place on base 30 by ring 10a secured to the cylinder 10. Sliding brushes 32 mounted on a brass ring 31 contact the cylinder 10 to provide good electrical contact. The ring 10a is held in place on base 30 by bolts 33. This construction allows the base 30 and dish 15 to be easily removed from the inside of the cylinder 10. The basic device operates without magnets as described in U.S. Pat. No. 4,507,588; however, it is preferred to use magnets 20, which are shielded when in the plasma 16, around the inside or outside of region 16 to confine the plasma 16.

In the improved apparatus a holder 39 is mounted spaced from the grid or screen 17 on a pedestal 40 in space 41 defined by vacuum chamber 42. An article 43 is biased by a D.C. or R.F. voltage source 44 and hybrid plasma 45 is produced from charged and excited species 46 from the disk plasma 16. A vacuum source 47 removes gas from the space 41. The article 43 is supported on an insulator 48 and biased by source 44.

FIG. 3 shows a variation of part of the apparatus of the present invention wherein gas is also fed by conduits 49 to the hybrid plasma 45a so as to treat the article 43a mounted on support 39a. The voltage source 44a biases the article 43a which is supported on an insulator 48a. This construction allows a different type of hybrid plasma 45 to be generated because of the gas from conduits 49.

The disk plasma 16 is used as a source of ions, electrons and free radicals. These species are drawn through the perforated grid or screen 17 by the vacuum pump 47 to the region where the article 43 to be treated is located on holder 39. The grid 17 may optionally be a single grid 17 or multiple grids (not shown) which can be biased in order to select and impart energy to certain plasma species.

A bias is applied to the article 43 to be treated by voltage source 44 in order to establish the hybrid plasma 45 over the article 43. Although the two plasmas 16 and 45 are physically separated, their properties are coupled. The hybrid plasma 45 is not completely a microwave plasma. Rather it is a hybrid of a microwave and dc (or rf, depending on the bias) plasma, since it includes species from both microwave excitation and D.C. (or R.F.) excitation. Reactive gases may be added to the hybrid plasma 45a from peripheral gas conduits 49 as shown in FIG. 3.

The dual plasmas offer increased flexibility in article 43 treatment. For example, it offers the combination of reactive ion etching and ion beam assisted etching. By adding reactive gases from gas conduits 49, a combination of chemically assisted ion beam etching and reactive ion etching results. Thus this apparatus and method allows new modes of operation for etching. In addition similar combinations are possible for low temperature oxidation and deposition.

The method and apparatus of the present invention allows hybrid plasma 45 or 45a processing using species found in a microwave plasma, but without direct exposure to the microwave disk plasma. For certain uses, the lack of direct exposure of a work surface to a highly energetic selected microwave plasma may be beneficial.

Thus the microwave plasma disk 16 is used as the source of ions, free radicals and electrons. The microwave plasma disk 16 is contained in the quartz dish 15 at the end of the tuned microwave cavity 11. The cavity 11 is mounted on a continuously pumped vacuum chamber 42. The screen, grid or other perforated plate 17 terminates the microwave cavity 11. Atoms, molecules, free radicals, electrons, and ions flow from the microwave disk plasma 16, downstream toward the article 45. The bias, dc or rf, is supplied by source 44 to the article 43. Treatment of the surface of the article 43 depends on the gases used. Oxygen leads to low temperature oxidation of the surface, $SiH_4$ or the like leads to deposition on the surface, and $CF_4$ or the like leads to etching of the surface.

Provided the power to the microwave disk plasma 16 is sufficient (on the order of 75 watts or higher) and provided the distance from the microwave disk plasma 16 is not too great (on the order of several cm but above about one centimeter and preferably between about 1 and 30 cm), then the hybrid plasma 45 is formed over the article 43. The hybrid plasma 45 is ignited by the applied bias from the dc or rf voltage source 44 and is contingent on the presence of the disk plasma 16. The hybrid plasma 45 incorporates and depends on the species generated by the disk plasma 16 and also generates additional ions and free radicals. This is the reason that it is a hybrid of a microwave and dc (or rf, depending on the bias) plasma, since it includes species from both. Thus the exact composition of ions or other atomic particles at article 43 can be adjusted by controlling the input microwave power into the cavity 11 or the applied voltage from a dc or rf voltage source 44.

Biasing of the grid 17 provides the capability of selectively attracting (or repelling) both positively and negatively charged species, that is ions or groups of ions, or electrons from the plasma by appropriate choice of bias. In addition to the charged species, other species including free radicals, atoms, and molecules continue to stream to the article 45 due to the vacuum pump 47. The apparatus allows combining a directed ion beam from the disk plasma 16 with reactive ion chemical processes occurring in the hybrid plasma 45. Single grid 17 operation allows very low energy ions to be incident on the article 43. Multiple grids (not shown) can allow a more energetic stream of incident ions.

The apparatus of FIG. 1 was operated in the dual plasma mode over a variety of pressure, powers, and bias levels. Low temperature oxidation in the dual plasma mode was observed using a silicon wafer as the article 43, and a dc applied bias which formed a hybrid plasma 45, approximately hemispherical in shape, over the silicon wafer.

FIG. 3 shows the apparatus where reactive gases are directed into the hybrid plasma 45a by gas conduits 49 in order to enhance treatment of the article 43a. The reactive gases may be $CF_4$ or the like, in which case etching of the article 43 occurs, or $SiH_4$ or the like, in which case deposition occurs, or $O_2$, in which case low temperature oxidation occurs. The potential applications include deposition, low temperature oxidation, and etching.

It is intended that the foregoing description be only illustrative of the present invention and that the present invention be limited only by the hereinafter appended claims.

We claim:
1. An ion generating apparatus for treating a surface which comprises:
   (a) a plasma source employing a radio frequency, including UHF or microwave, applicator which is metallic and in the shape of a hollow cavity and which is excited in one or more of its TE or TM modes of resonance and optionally including a static magnetic field surrounding the plasma source which aids in coupling electromagnetic energy to the plasma electrons at electron cyclotron resonance and aids in confining the charged species in the discharge chamber, wherein the plasma is maintained at a reduced pressure and wherein the ion source apparatus includes an electrically insulated chamber having a central longitudinal axis mounted in closely spaced relationship to an area of the applicator defining an opening from the chamber;
   (b) a perforated means acting as a grid or screen adjacent the opening which allows ions, free radicals and electrons to be removed from the plasma;
   (c) gas supply means for providing a gas which is ionized to form the plasma in the insulated chamber, wherein the radio frequency wave applied to the applicator creates and maintains the plasma in the shape of an elongate plasma disk perpendicular to and surrounding the central longitudinal axis in the chamber;
   (d) metal plate means in the cavity mounted perpendicular to the axis;
   (e) probe means connected to and extending inside the applicator for coupling electromagnetic energy to the applicator, wherein the plate means and the probe means in the applicator achieves the selected TE or TM mode of resonance of the radio frequency wave in the applicator;
   (f) ion attracting means mounted in spaced relationship to the perforated means outside of the chamber for attachment to the surface to be treated for purposes of igniting a hybrid plasma and for attracting ions from the plasma to the surface by bias means providing a suitable voltage potential; and
   (g) a platform means supporting the surface to be treated which is electrically insulated by an insulator means from the ion attracting means, wherein the ion attracting means and platform means are spaced from the plasma in the chamber such that the hybrid plasma is formed adjacent to the ion attracting means which is separate from the elongate plasma disk.

2. The apparatus of claim 1 wherein the platform means is mounted on a hollow tube through which a wire is inserted and electrically connected to the surface, wherein the wire provides the voltage potential.

3. The apparatus of claim 2 wherein the platform means is a conductive metal and wherein an insulator is provided between the platform means and the article to be treated.

4. The apparatus of claim 1 wherein the perforated means and the ion attracting means are separated by a distance of greater than about one centimeter.

5. The apparatus of claim 1 wherein the perforated means is biased to attract or repel positive or negative ions or electrons in the chamber.

6. The apparatus of claim 1 wherein the plate means and probe means are moveable for the purpose of selecting a particular mode of resonance of the microwave or UHF applicator and for varying the mode to match the applicator.

7. The apparatus of claim 1 wherein the magnets are provided outside the insulated chamber.

8. A method for treating a surface which comprises:
(a) providing an ion generating apparatus including a plasma source employing a radio frequency, including UHF or microwave, applicator, which is metallic and in the shape of a hollow cavity and which is excited in one or more of its TE or TM modes of resonance and optionally including a static magnetic field surrounding the plasma source which aids in coupling electromagnetic energy to plasma electrons at electron cyclotron resonance and aids in confining the charged species in the discharge chamber, wherein the plasma is maintained at a reduced pressure, wherein the ion generating apparatus further includes an electrically insulated chamber having a central longitudinal axis and mounted in closely spaced relationship to an area of the applicator defining an opening from the chamber, further includes a perforated means acting as a grid or screen adjacent the opening which allows the ions, free radicals and electrons to be removed from the chamber, further includes a gas supply means for providing a gas which is ionized to form the plasma in the insulated chamber, wherein the radio frequency wave applied to the applicator creates and then maintains the plasma in the shape of an elongate, thin plasma disk perpendicular to and surrounding the central axis in the chamber; further includes metal plate means mounted perpendicular to the axis, further including a probe means connected to and extending inside the applicator for coupling the radio frequency waves to the applicator, wherein the plate means and the probe means in the applicator achieves a selected TE or TM mode of resonance of the radio frequency wave in the applicator, further includes ion attracting means mounted in spaced relationship to the perforated means outside of the chamber attached to the surface to be treated for purposes of igniting the plasma and for attracting ions from the plasma by bias means providing a suitable voltage potential and further including a platform means supporting the surface to be treated which is electrically insulated by an insulating means from the ion attracting means wherein the ion attracting means and platform means are spaced from the plasma in the chamber such that a hybrid ion and microwave plasma is formed adjacent to the ion attracting means which is separate from the elongate plasma disk;
(b) forming the plasma disk in the chamber and the separate hybrid plasma adjacent the ion attracting means; and
(c) attracting the ions from the hybrid plasma to the surface with the bias means having a suitable voltage potential attached to the surface.

9. The method of claim 8 wherein the bias means is a wire and circuit biasing the surface to be treated with a voltage which attracts or repels the ions.

10. The method of claim 9 wherein the platform means is mounted on a hollow tube through which a wire is inserted and electrically connected to the surface, wherein the wire provides the voltage potential.

11. The method of claim 10 wherein the platform means is a conductive metal and wherein an insulator is provided between the platform means and the article to be treated.

12. The method of claim 8 wherein the perforated means and the ion attracting means are separated by a distance of greater than about one centimeter.

13. The method of claim 8 wherein the perforated means is biased to attract or repel positive or negative ions in the chamber.

14. The method of claim 8 wherein the plate means and probe means are moveable and the mode of the microwave or UHF applicator is varied with the plate means and probe means.

15. The method of claim 8 wherein magnets are provided outside the insulated chamber.

16. The apparatus of claim 1 wherein the bias means is selected from D.C. and R.F.

17. The method of claim 8 wherein the bias means is selected from D.C. and R.F.

* * * * *